(12) United States Patent
Lee

(10) Patent No.: US 7,564,232 B2
(45) Date of Patent: Jul. 21, 2009

(54) CHARGING CIRCUIT AND CONTROL METHOD AND INTEGRATED CIRCUIT UTILIZING THE SAME

(75) Inventor: Yung Ming Lee, Jhonghe (TW)

(73) Assignee: Princeton Technology Corporation, Taipei (TW)

( * ) Notice: Subject to any disclaimer, the term of this patent is extended or adjusted under 35 U.S.C. 154(b) by 200 days.

(21) Appl. No.: 11/356,037

(22) Filed: Feb. 17, 2006

(65) Prior Publication Data

US 2007/0052476 A1 Mar. 8, 2007

(30) Foreign Application Priority Data

Sep. 2, 2005 (TW) .............................. 94130073 A

(51) Int. Cl.
*G05F 1/00* (2006.01)
(52) U.S. Cl. .................... 323/284; 323/271; 323/282
(58) Field of Classification Search .................. 330/10; 323/226, 269, 271, 273, 270, 282, 284; 327/157, 327/56, 148
See application file for complete search history.

(56) References Cited

U.S. PATENT DOCUMENTS

| | | | |
|---|---|---|---|
| 7,053,704 B2 * | 5/2006 | Forel et al. ..................... 330/69 |
| 7,161,337 B2 * | 1/2007 | Nishimori .................... 323/271 |
| 7,202,644 B2 * | 4/2007 | Nitta et al. ................... 323/259 |
| 2002/0039018 A1 * | 4/2002 | Sanzo et al. ................. 323/282 |
| 2002/0057082 A1 * | 5/2002 | Hwang ........................ 323/284 |
| 2005/0253650 A1 * | 11/2005 | Chang et al. .................. 330/51 |

* cited by examiner

*Primary Examiner*—Bao Q Vu
*Assistant Examiner*—Nguyen Tran
(74) *Attorney, Agent, or Firm*—Muncy, Geissler, Olds & Lowe, PLLC

(57) ABSTRACT

A charging circuit for a bridge tied load (BTL) including an amplifier and a load driven by the amplifier according to a voice signal and a reference voltage stored in a reference capacitor. The charging circuit comprises a power supply and a comparison unit. The power supply provides one of a first voltage and a second voltage to the reference capacitor according to a control signal. The reference voltage is generated by the reference capacitor according to the first voltage and the second voltage. The comparison unit deactivates the control signal and provides the first voltage to the reference capacitor when the reference voltage is less than a first predetermined value. The comparison unit activates the control signal and provides the second voltage to the reference capacitor when the reference voltage is less than a second predetermined value and exceeds or equals the first predetermined value.

26 Claims, 13 Drawing Sheets

CHARGING CIRCUIT AND CONTROL METHOD AND INTEGRATED CIRCUIT UTILIZING THE SAME

BACKGROUND OF THE INVENTION

1. Field of the Invention

The present invention relates to a charging circuit, and in particular relates to a charging circuit for a bridge tied load (BTL).

2. Description of the Related Art

FIG. 1 is a schematic diagram of a conventional bridge tied load (BTL). When the resistances of resistors R1 and R2 are the same, if voltage Vcc is provided to a BTL 10 and a voice signal VAC is not provided to the BTL 10, a capacitor C1 starts charging. When the voltage of an endpoint 11 is equal to Vcc/2, the capacitor C1 stops charging. Therefore, the voltage of an endpoint 12 is approximately equal to the voltage of endpoint 11 and the voltage of an endpoint 13 is equal to Vcc/2 according to a characteristic of an amplifier.

Since a load RL is coupled between an endpoint 14 and an endpoint 15 coupled to ground, the voltage of endpoint 14 is equal to that of endpoint 15. When voltages of endpoints 13 and 14 are different, a capacitor C2 starts charging until the voltage of endpoint 14 is equal to that of endpoint 12 such as Vcc/2. When the voltage of endpoint 14 differs from that of endpoint 15, one current is generated across load RL. When load RL is a speaker, for example, the current generated across load RL causes the speaker to generate an abnormal voice.

FIG. 2a is a schematic diagram of another conventional BTL. When the resistances of resistors R1 and R2 are the same, at this moment, if voltage Vcc is provided to a BTL 20 and a voice signal VAC is not provided to the BTL 20, a capacitor C3 starts charging.

When the voltage of an endpoint 21 is less than Vcc/2, switch units SW1, SW2 are short. Therefore, the voltage of an endpoint 23 is equal to that of an endpoint 24 such that an abnormal voice is not generated by a speaker 27.

Due to the action of a capacitor C4, the period time that the voltage of endpoint 21 reaches to Vcc/2 is faster than that of an endpoint 22. For example, when the voltage of endpoint 21 is equal to Vcc/2 such as 6V, the voltage of point 22 is approximately equal to 5V at the same period time.

Since the voltage of endpoint 21 is equal to Vcc/2, switch units SW1 and SW2 are open. At the same time, the voltage of point 22 is approximately equal to 5V and the voltages of positive phase terminals of amplifiers 25 and 26 are approximately equal to Vcc/2, the voltage of endpoint 23 is approximately equal to 7V and that of endpoint 24 is approximately equal to 5V. Therefore, speaker 27 generates an abnormal voice. Additionally, when resistances of resistors R1 and R2 are the same, the voltage of endpoint 21 is equal to Vcc/2. However, when there is a fabrication difference that makes the resistances of resistors R1 and R2 different, the voltage of endpoint 21 is unequal Vcc/2. Such that switch units SW1 and SW2 are short and the BTL 20 is not operated.

FIG. 2b is a curve diagram of the voltage of endpoint 21 shown in FIG. 2a. Assuming that high voltage Vcc is equal to 5V. If the resistance of resistor R1 is equal to 50K and that of resistor R2 is equal to 49K, the voltage of endpoint 21 is approximately equal to 2.47V.

FIG. 3a is a schematic diagram of another conventional BTL. Capacitor C5 of this conventional BTL 200 is charged by a constant current source I such that the period time that the voltage of endpoint 201 reaches to Vcc/2 is faster than the voltage of endpoint 202. When voltages of endpoints 201 and 202 are different, voltages of endpoints 203 and 204 are different also. Therefore, speaker 207 generates an abnormal voice.

FIG. 3b is a curve diagram of the voltage of point 201 shown in FIG. 3a. Assuming that high voltage Vcc is equal to 5V. At time t1, the voltage of endpoint 201 is approximately equal to 2.5V.

FIG. 3c is a status diagram of speaker 207 shown in FIG. 3a. Although the voltage of endpoint 201 reaches 2.5V, the voltage of endpoint 202 is not equal to 2.5V at the same time. There is a voltage difference across speaker 207 approximately equal to 200 mV, so that the speaker 207 generates an abnormal voice.

BRIEF SUMMARY OF THE INVENTION

Charging circuits are provided. An exemplary embodiment of a charging circuit, which is applied in a bridge tied load (BTL) comprising an amplifier and a load driven by the amplifier according to a voice signal and a reference voltage stored in a reference capacitor. The charging circuit comprises a power supply and a comparison unit. The power supply provides one of a first voltage and a second voltage to the reference capacitor according to a control signal. The reference voltage is generated by the reference capacitor according to the first voltage and the second voltage. The comparison unit deactivates the control signal and provides the first voltage to the reference capacitor when the reference voltage is less than a first predetermined value and activates the control signal and provides the second voltage to the reference capacitor when the reference voltage is less than a second predetermined value and exceeds or equals the first predetermined value.

Integrated circuits are also provided. An exemplary embodiment of an integrated circuit, which drives a load. The integrated circuit comprises a reference capacitor, an amplifier, a power supply, and a comparison unit. The reference capacitor stores a reference voltage. The amplifier drives the load according to a voice signal and the reference voltage. The power supply provides one of a first voltage and a second voltage to the reference capacitor according to a control signal. The reference voltage is generated by the reference capacitor according to the first voltage and the second voltage. The comparison unit deactivates the control signal and provides the first voltage to the reference capacitor when the reference voltage is less than a first predetermined value and activates the control signal and provides the second voltage to the reference capacitor when the reference voltage is less than a second predetermined value and exceeds or equals the first predetermined value.

Control methods are also provided. An exemplary embodiment of a control method, which is applied in a bridge tied load (BTL) comprising an amplifier and a load driven by the amplifier according to a voice signal and a reference voltage stored in a reference capacitor. The control method comprises: providing a first voltage to the reference capacitor; determining whether the reference voltage exceeds a first value; providing the first voltage to the reference capacitor when the reference voltage is less than the first predetermined value; providing a second voltage to the reference capacitor when the reference voltage exceeds the first predetermined value; determining whether the reference voltage exceeds a second value; and providing the second voltage to the reference capacitor when the reference voltage is less than the second predetermined value.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIG. 2b is a curve diagram of the voltage of endpoint 21 shown in FIG. 2a;

FIG. 3b is a curve diagram of the voltage of endpoint 201 shown in FIG. 3a;

FIG. 3c is a status diagram of speaker 207 shown in FIG. 3a;

FIG. 9a is a voltage curve diagram of endpoint 201 shown in FIG. 3a; and

FIG. 9b is a state diagram of speaker 207 shown in FIG. 3a.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 4:
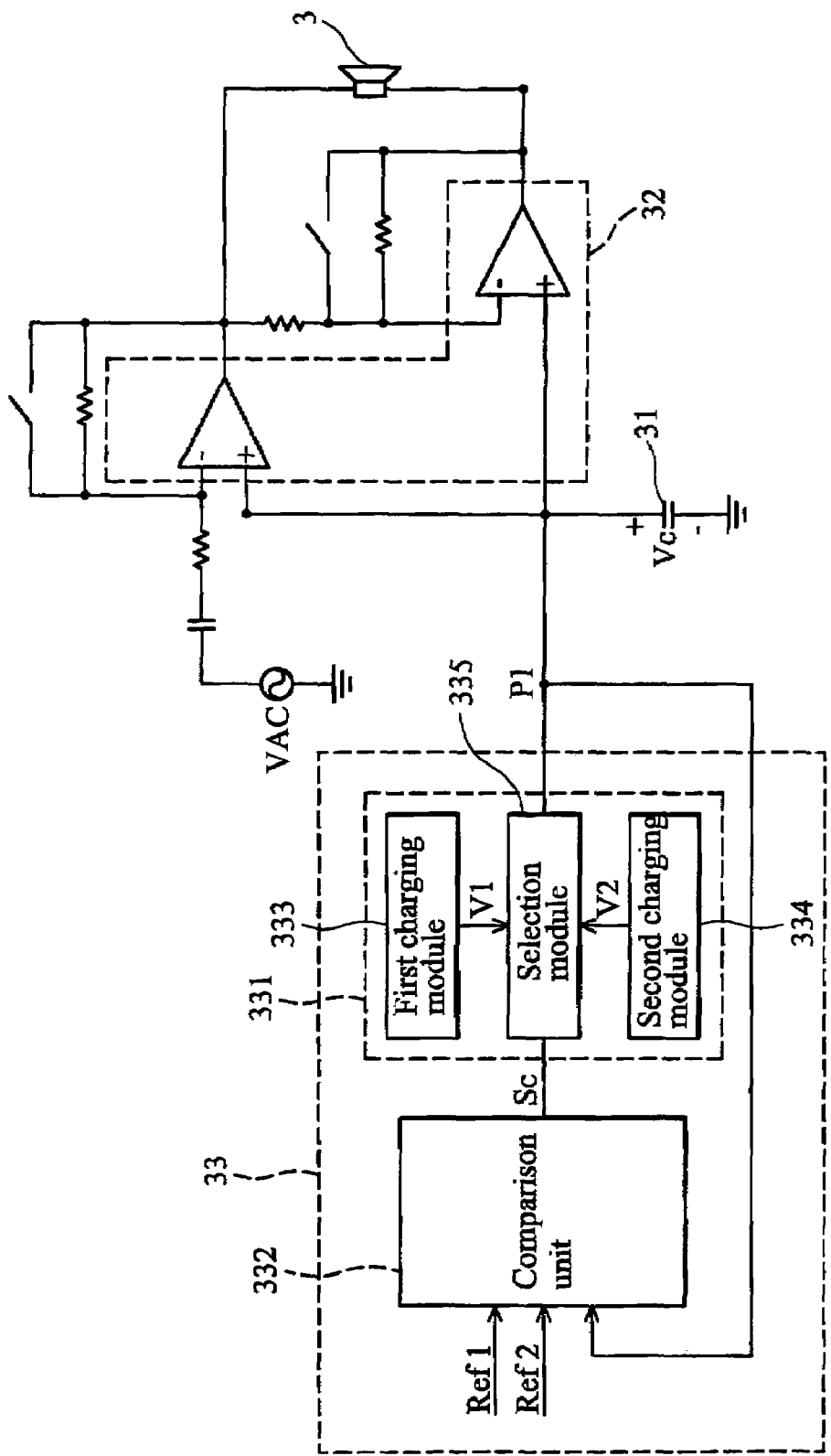
FIG. 4 is a schematic diagram of an exemplary embodiment of an integrated circuit of the present invention.

FIG. 4 is a schematic diagram of an exemplary embodiment of an integrated circuit of the present invention. The integrated circuit is used to drive a load 3 and comprises a reference capacitor 31, an amplifier 32, and a charging circuit 33. Reference capacitor 31 is used to store reference voltage Vc. Amplifier 32 drives load 3 according to a voice signal VAC and reference voltage Vc. A BTL is constituted by amplifier 32 and load 3.

Charging circuit 33 comprises a power supply 331 and a comparison unit 332. Power supply 331 provides voltage V1 or voltage V2 to reference capacitor 31 according to a control signal Sc.

The control signal Sc is deactivated by comparison unit 332 and the voltage V1 is provided to reference capacitor 31 when the reference voltage Vc is less than a predetermined value Ref1. The control signal Sc is activated by comparison unit 332 and the voltage V2 is provided to reference capacitor 31 when the reference voltage Vc is less than a predetermined value Ref2 and exceeds or equals the predetermined value Ref1. The control signal Sc is deactivated by comparison unit 332 and the voltage V1 is provided to reference capacitor 31 when the reference voltage Vc exceeds or equals the predetermined value Ref2.

In this embodiment, power supply 331 comprises a first charging module 333, a second charging module 334, and selection module 335. First charging module 333 is used to provide the voltage V1 and the second charging module 334 is used to provide the voltage V2. Selection module 335 is coupled among first charging module 333, second charging module 334, and reference capacitor 31. When the control signal Sc is deactivated, selection module 335 provides the voltage V1 to reference capacitor 31. When the control signal Sc is activated, selection module 335 provides the voltage V2 to reference capacitor 31.

Figure 5:
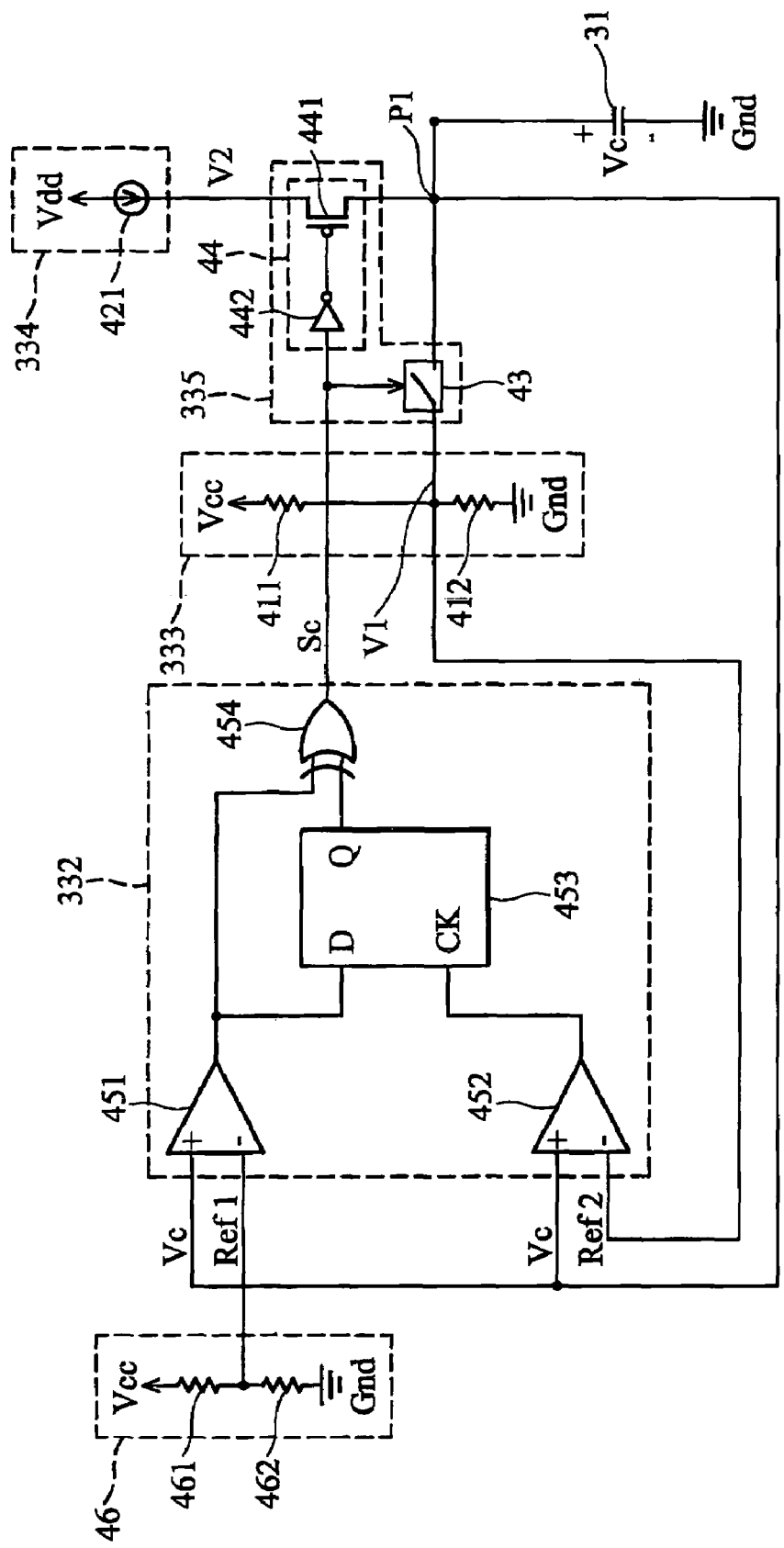
FIG. 5 is a schematic diagram of an exemplary embodiment of the charging circuit of the present invention.

FIG. 5 is a schematic diagram of an exemplary embodiment of the charging circuit of the present invention. First charging module 333 and second charging module 334 is a voltage divider or a constant current source respectively. In this embodiment, first charging module 333 comprises resistors 411 and 412 for providing the voltage V1. Resistors 411, 412 are serially connected between high voltage Vcc and low voltage Gnd for forming a voltage divider. Second charging module 334 comprises a constant current source 421 for providing the voltage V2.

Selection module 335 comprises a first switch unit 43 and a second switch unit 44. First Switch unit 43 is coupled between first charging module 333 and reference capacitor 31. When the control signal is deactivated, first switch unit 43 is turned on. When the control signal is activated, first switch unit 43 is turned off.

Second Switch unit 44 comprises a PMOS transistor 441 and an inverter 442. A source of PMOS transistor 441 is coupled to second charging module 334 and a drain thereof is coupled to reference capacitor 31. An input terminal of inverter 442 receives the control signal Sc and an output terminal thereof is coupled to a gate of PMOS transistor 441. When the control signal Sc is deactivated, PMOS transistor 441 is turned off. When the control signal is activated, PMOS transistor 441 is turned on.

Comparison unit 332 comprises a first comparator 451, a second comparator 452, a D-type flip-flop 453, and a logic unit 454. A positive phase terminal of first comparator 451 receives the reference voltage Vc and a negative phase terminal thereof receives the predetermined value Ref1 for comparing the reference voltage Vc with the predetermined value Ref1. When the reference voltage Vc exceeds or equals the predetermined value Ref1, a high logic level is output from first comparator 451. When the reference voltage Vc is less than the predetermined value Ref1, a low logic level is output from first comparator 451.

A positive phase terminal of second comparator 452 receives the reference voltage Vc and a negative phase terminal thereof receives the predetermined value Ref2 for comparing the reference voltage Vc with the predetermined value Ref2. When the reference voltage Vc exceeds or equals the predetermined value Ref2, a high logic level is output from second comparator 452. When the reference voltage Vc is less than the predetermined value Ref2, a low logic level is output from second comparator 452.

Additionally, charging circuit 33 further comprises a voltage divider 46 for providing the predetermined value Ref1. In this embodiment, voltage divider 46 comprises resistors 461 and 462. Resistors 461 and 462 are serially connected between the high voltage Vcc and the low voltage Gnd. To simplify circuit structure, the predetermined value Ref2 is the voltage V1 generated from first charging module 333.

An input terminal D of D-type flip-flop 453 is coupled to the output terminal of first comparator 451, a clock terminal CK thereof is coupled to the output terminal of second comparator 452. When a signal received by the clock terminal CK is in a rising edge, an output terminal Q of D-type flip-flop 453 outputs a signal received by the input terminal D.

A first input terminal of logic unit 454 is coupled to the output terminal Q of D-type flip-flop 453, a second input terminal thereof is coupled to the output terminal of first comparator 451, and an output terminal thereof outputs the control signal Sc. In this embodiment, logic unit 454 is a XOR gate.

The operating principle of the charging circuit is described as follows. Assuming that resistances of resistors 411 and 412 are the same, the output terminal Q of D-type flip-flop 453 outputs a low logic level, first switch unit 43 is turned on, and second switch unit 44 is turned off.

Since first switch unit 43 is turned on, reference capacitor 31 receives the voltage V1 provided by first charging module 333 and starts charging. When the reference voltage Vc is less than the predetermined values Ref1 and Ref2, first comparator 451 outputs a low logic level and second comparator 452 also outputs a low logic level. Therefore, logic unit 454 outputs a low logic level for deactivating the control signal Sc.

When the control signal Sc is deactivated, first switch unit 43 is continuously turned on and PMOS transistor 441 holds on turned off. Therefore, reference capacitor 31 receives the voltage V1 provided from first charging module 333.

When reference voltage Vc is less than the predetermined value Ref2 and exceeds or equals the predetermined value Ref1, first comparator 451 outputs a high logic level and second comparator 452 outputs the low logic level. Therefore, logic unit 454 outputs a high logic level for activating the control signal Sc.

When the control signal Sc is activated, first switch unit 43 is turned off and PMOS transistor 441 is turned on. Therefore, reference capacitor 31 receives the voltage V2 provided from second charging module 334.

When reference voltage Vc exceeds the predetermined values Ref1 and Ref2, first comparator 451 outputs the high logic level and second comparator 452 also outputs a high logic level. Therefore, the clock terminal CK of D-type flip-flop 453 is triggered such that logic unit 454 deactivates the control signal Sc.

When the control signal Sc is deactivated, first switch unit 43 is turned on and PMOS transistor 441 is turned off. Therefore, reference capacitor 31 receives the voltage V1 provided from first charging module 333.

Since the charging circuit of the present invention provides different voltages for charging the reference capacitor according to the reference voltages. When the charging circuit is applied in BTL, the charging circuit prevents a speaker from generating an abnormal voice caused by the reference capacitor charged in a transient period.

Figure 6:
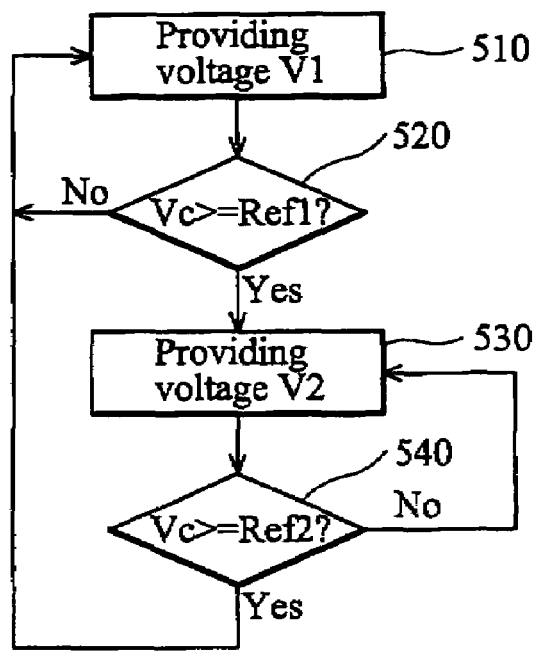
FIG. 6 is a flowchart of an embodiment of a control method of the present invention.

FIG. 6 is a flowchart of an embodiment of a control method of the present invention. With reference to FIG. 4, the control method is described as follows. Voltage V1 is provided to reference capacitor 31 for charging in step 510. Reference voltage Vc is detected in step 520.

When the reference voltage Vc is less than a predetermined value Ref1, the voltage V1 is continuously provided to reference capacitor 31 in step 510. Therefore, reference capacitor 31 is continuously charging. When the reference voltage Vc exceeds or equals the predetermined value Ref1, voltage V2 is provided to reference capacitor 31 in step 530.

The reference voltage Vc is detected in step 540. When the reference voltage Vc is less than a predetermined value Ref2, the voltage V2 is continuously provided to reference capacitor 31 in step 530. When the reference voltage Vc exceeds or equals the predetermined value Ref2, the voltage V1 is provided to reference capacitor 31 in step 510.

Figure 7:
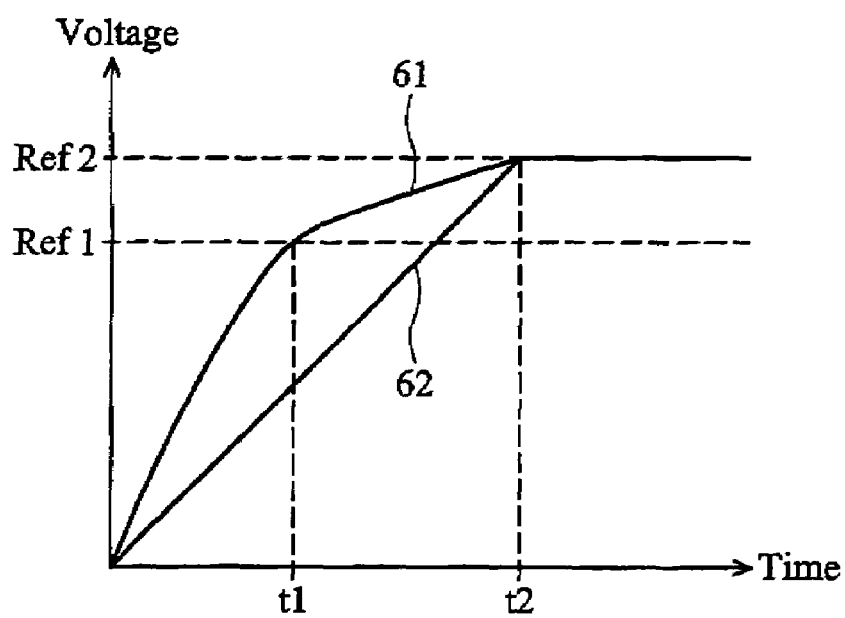
FIG. 7 is a charging curve diagram of the reference capacitor 31 of the present invention.

FIG. 7 is a charging curve diagram of the reference capacitor 31 of the present invention. With reference to FIG. 5.

When reference capacitor 31 is charged and utilizes the control method, curve 61 is obtained. Before time t1, since the reference voltage Vc is less than the predetermined value Ref1, reference capacitor 31 is charged by the voltage V1. Therefore, charging time of reference capacitor 31 is faster. When the reference voltage is less than the predetermined value Ref2 and exceeds or equals the predetermined value Ref1, reference capacitor 31 is charged by the voltage V2. Therefore, the charging time of reference capacitor 31 is slower.

Figure 1:
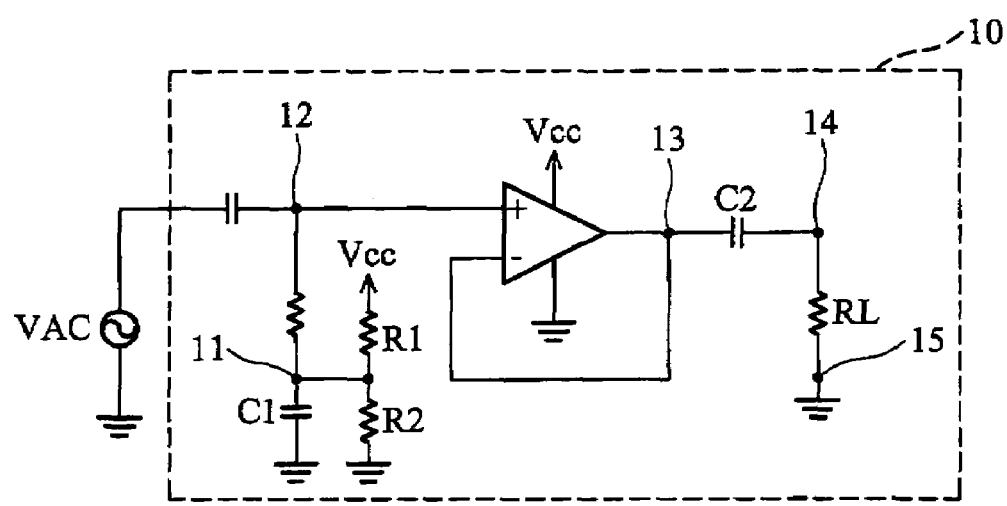
FIG. 1 is a schematic diagram of a conventional bridge tied load (BTL)
Figure 2A:
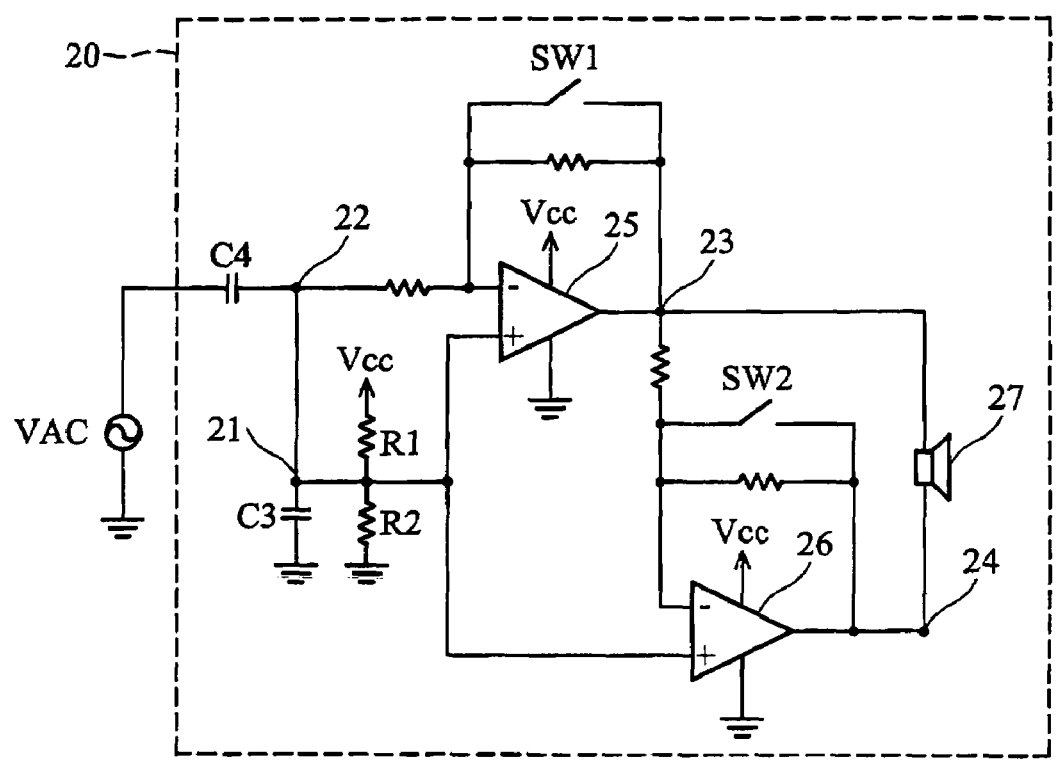
FIG. 2a is a schematic diagram of another conventional BTL.
Figure 2B:
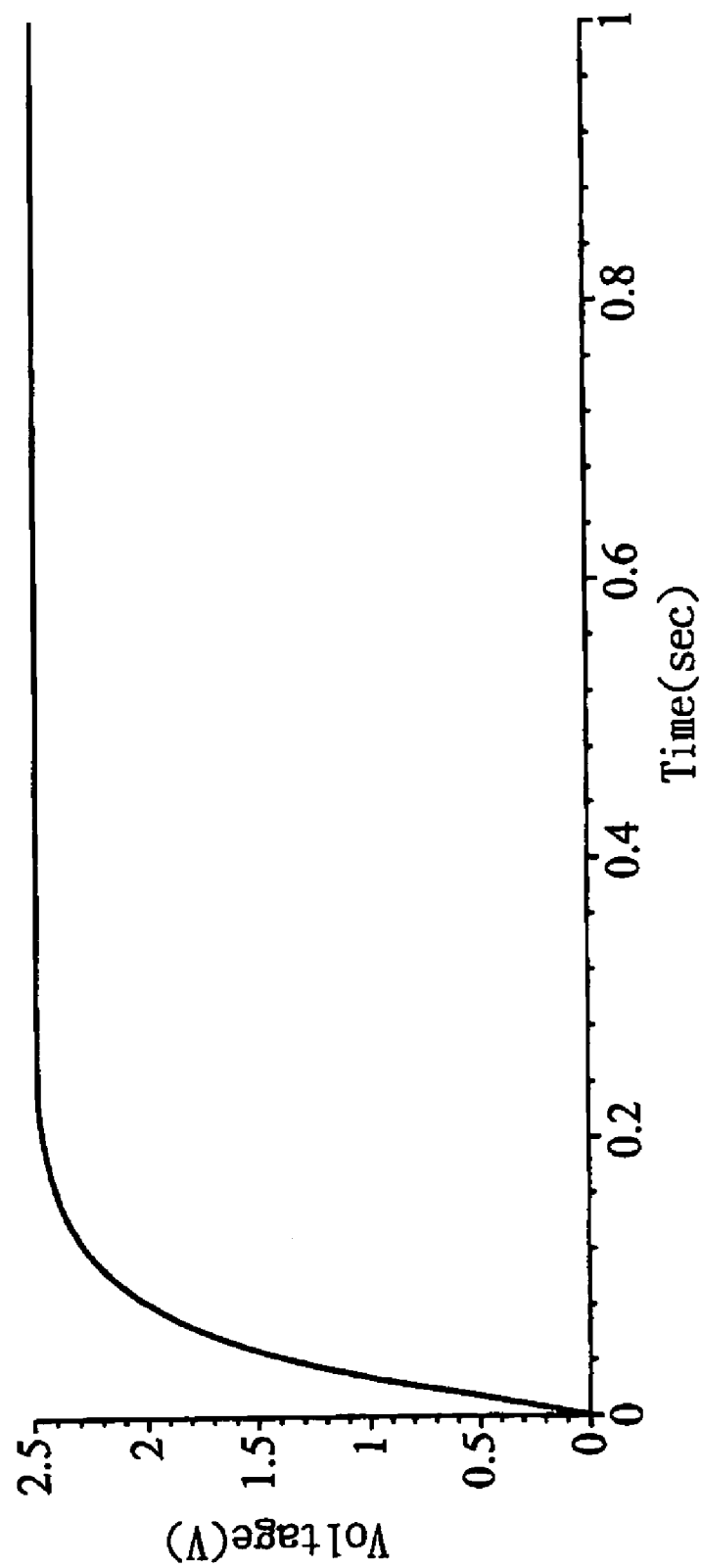

Curve 62 represents a charging curve of the capacitor C3 shown in FIG. 2a. To compare curves 61 and 62, slope of curve 61 is less than that of curve 62 between times t1 and t2. Therefore, when the charging circuit 33 is applied in BTL, an abnormal voice is hardly generated from a speaker and when the conventional charging circuit is applied in BTL, the abnormal voice is more easily generated from a speaker.

Figure 8A:
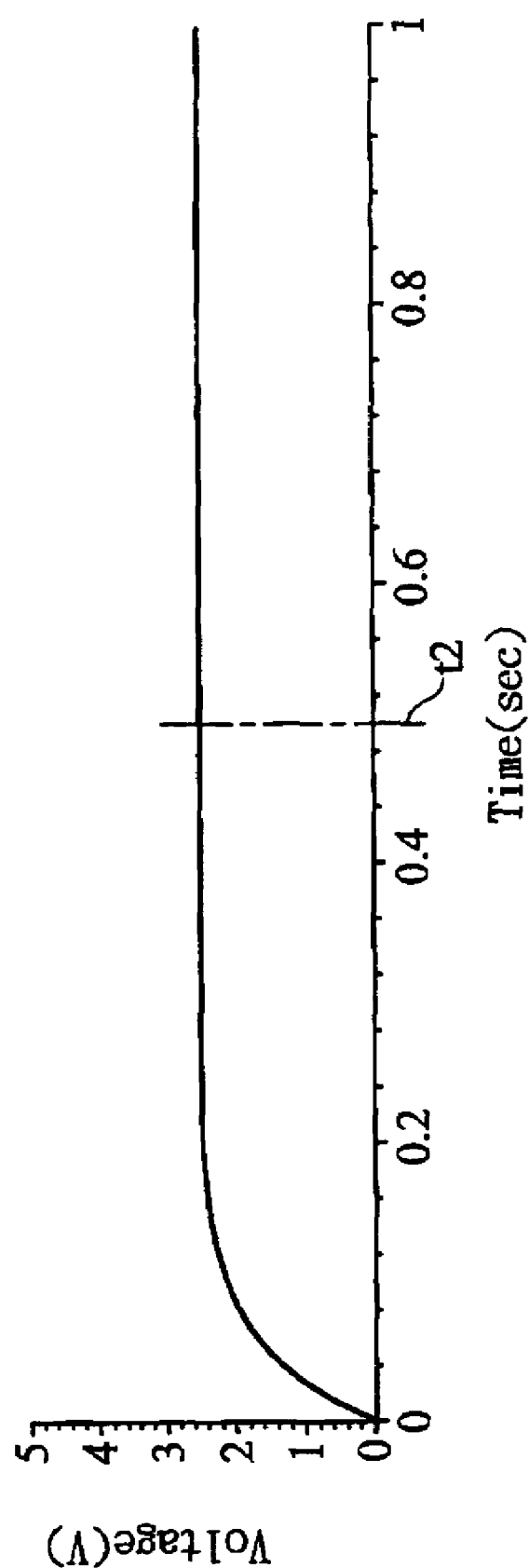
FIG. 8a is a voltage curve diagram of point P1 shown in FIG. 4.
Figure 8B:
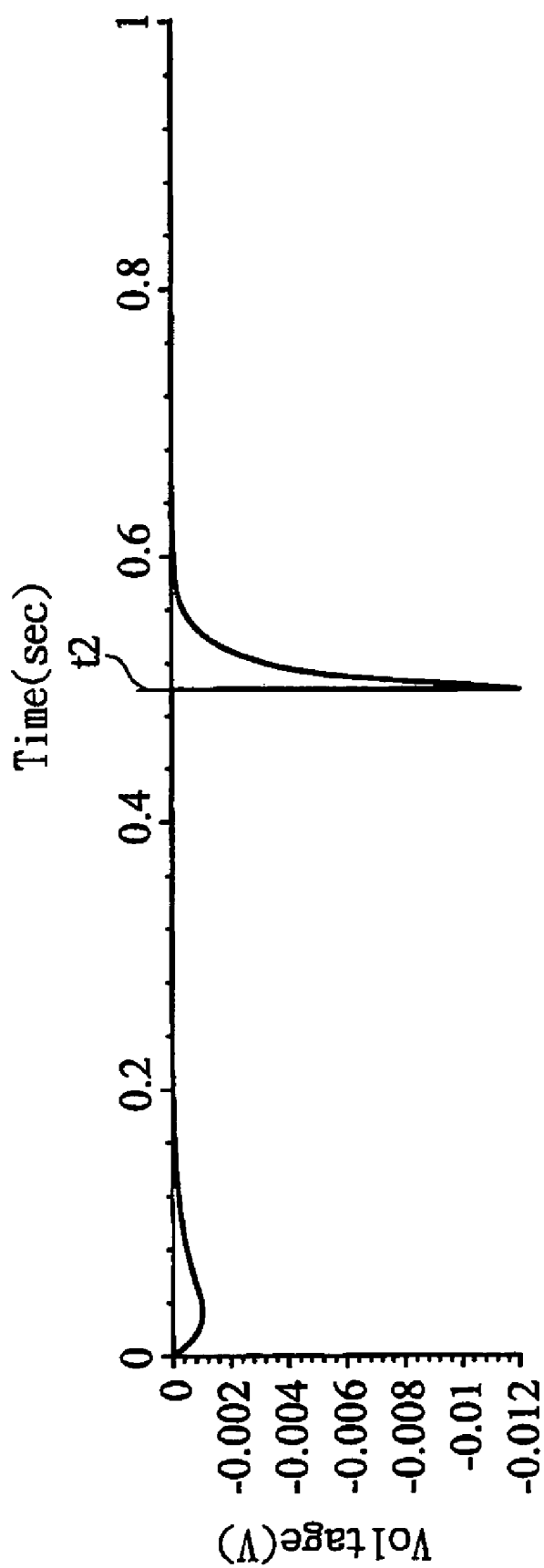
FIG. 8b is a state diagram of speaker 3 shown in FIG. 4.

FIG. 8a is a voltage curve diagram of point P1 shown in FIG. 4. FIG. 8b is a state diagram of speaker 3 shown in FIG. 4. Assuming that the high voltage Vcc is equal to 5V, at time t2, the voltage of endpoint P1 reaches 2.5V and voltage difference across the speaker 3 is approximately equal to 12 mV. To compare FIG. 3c with FIG. 8b, voice generated by speaker 3 is smaller than voice generated by speaker 207, wherein time t1 is equal to time t2.

Figure 3A:
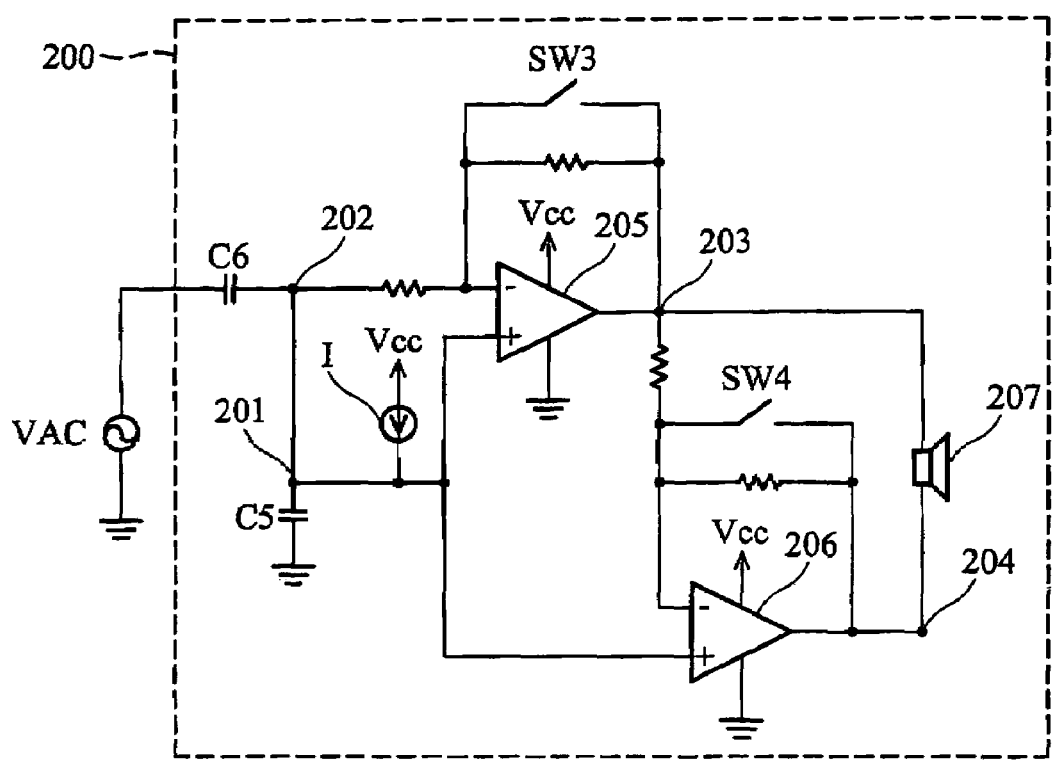
FIG. 3a is a schematic diagram of another conventional BTL.
Figure 3B:
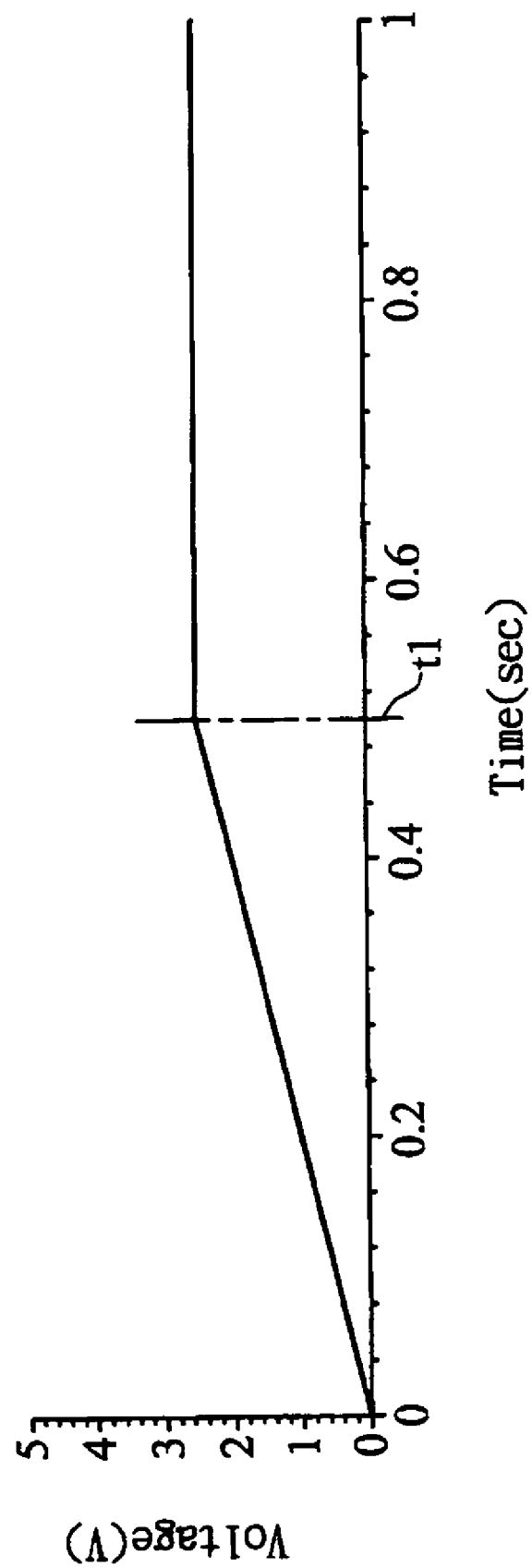
Figure 3C:
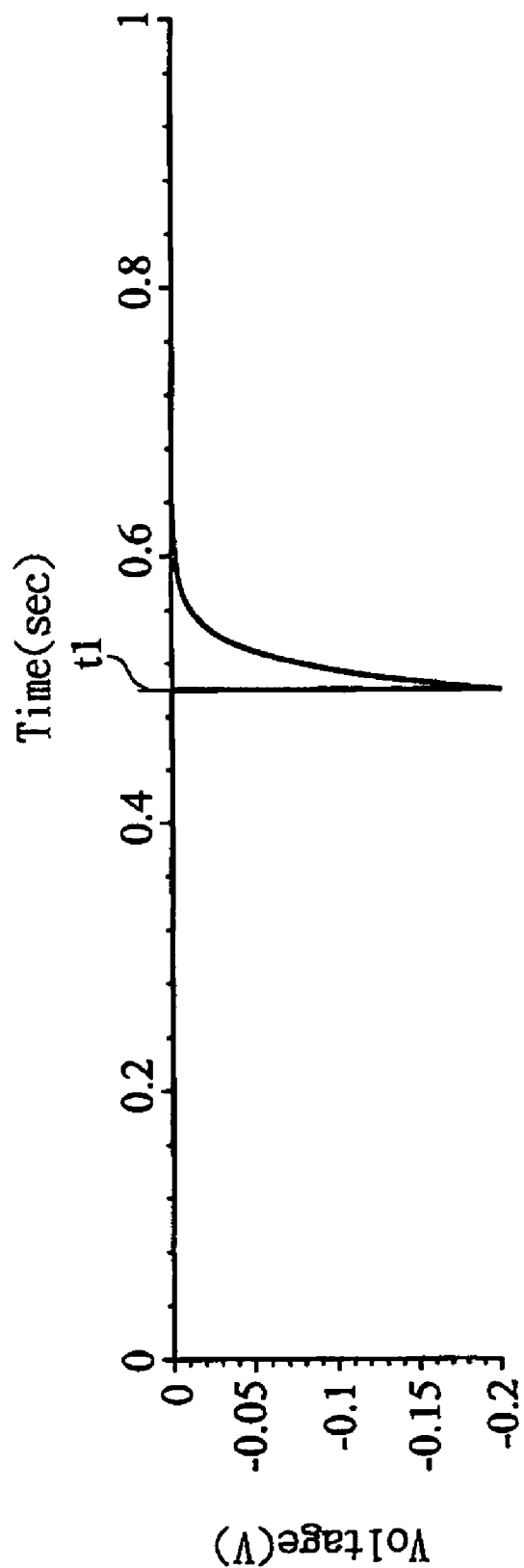
Figure 9A:
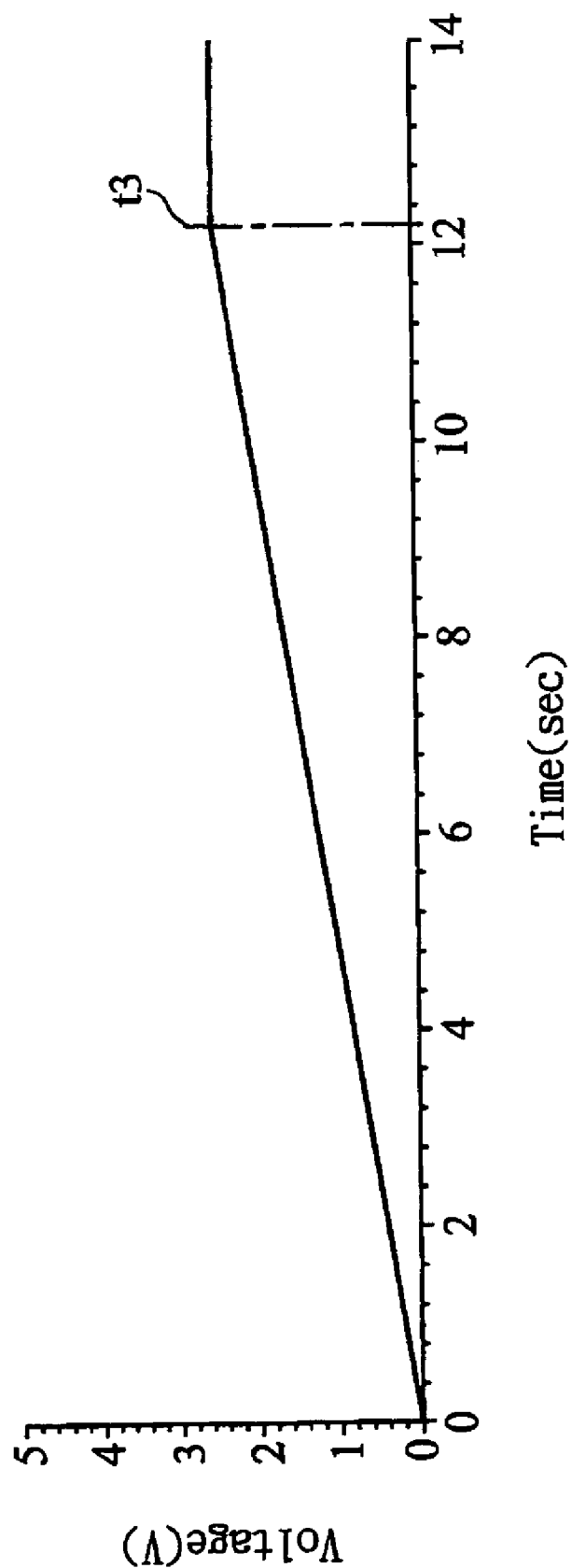
Figure 9B:
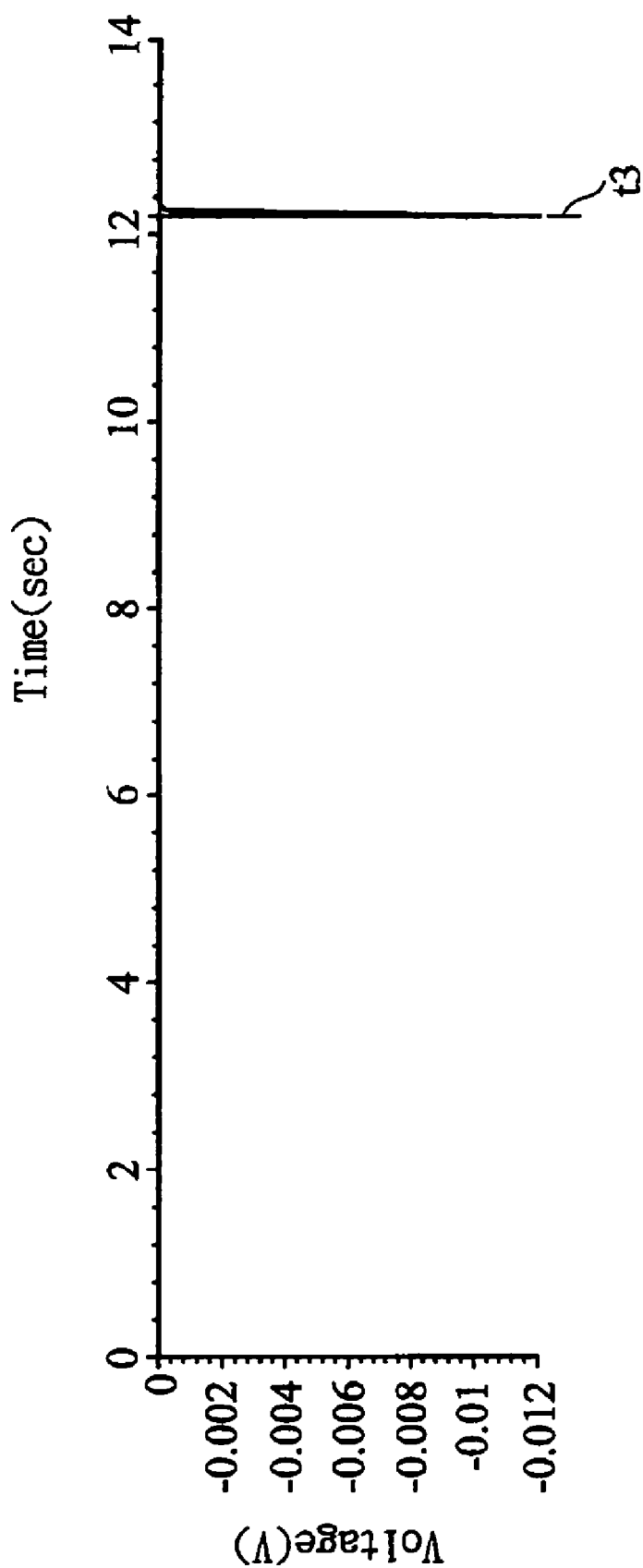

As charging time of capacitor C5 shown in FIG. 3a is increased, the voltage curve diagram of endpoint 201 is shown in FIG. 9a and state diagram of speaker 207 is shown in FIG. 9b. As shown in FIG. 9a, the voltage of endpoint 201 is equal to 2.5V and the voltage of the endpoint 202 is approximately equal to 2.5V at time t3, wherein time t3 is quite longer than time t2. Therefore, the voltage of endpoint 202 also approaches 2.5V such that voltage difference across speaker 207 is approximately 12 mV.

As discussed above, the reference capacitor 31 receives different charging voltages according to the voltages of endpoint P1, charging time of the reference capacitor 31 is shorter and voice generated by the speaker is smaller.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A charging circuit for a bridge tied load (BTL) comprising an amplifier and a load driven by the amplifier according to a voice signal and a reference voltage stored in a reference capacitor, comprising:

a power supply providing one of a first voltage and a second voltage to the reference capacitor according to a control signal, wherein the reference voltage is generated by the reference capacitor according to the first voltage and the second voltage; and a comparison unit deactivating the control signal and providing the first voltage to the reference capacitor when the reference voltage is less than a first predetermined value and activating the control signal and providing the second voltage to the reference capacitor when the reference voltage is less than a second predetermined value and exceeds or equals the first predetermined value.

2. The charging circuit as claimed in claim 1, wherein the control signal is deactivated by the comparison unit when the reference voltage exceeds or equals the second predetermined value.

3. The charging circuit as claimed in claim 1, wherein the power supply comprises:
   a first charging module providing the first voltage; and
   a second charging module providing the second voltage.

4. The charging circuit as claimed in claim 3, wherein the first charging module is a voltage divider or a constant current source and wherein the second charging module is a voltage divider or a constant current source.

5. The charging circuit as claimed in claim 3, wherein the power supply further comprises a selection module coupled to the first charging module, the second charging module and the reference capacitor for providing the first voltage to the reference capacitor when the control signal is deactivated and providing the second voltage to the reference capacitor when the control signal is activated.

6. The charging circuit as claimed in claim 5, wherein the selection module comprises:
   a first switch unit coupled between the first charging module and the reference capacitor, wherein the first switch unit is turned on when the control signal is deactivated and the first switch unit is turned off when the control signal is activated; and
   a second switch unit coupled between the second charging module and the reference capacitor, wherein the second switch unit is turned off when the control signal is deactivated and the second switch unit is turned on when the control signal is activated.

7. The charging circuit as claimed in claim 6, wherein the second switch unit comprises:
   a PMOS transistor comprising a gate, a source coupled to the second charging module, and a drain coupled to the reference capacitor; and
   an inverter comprising an input terminal receiving the control signal and an output terminal coupled to the gate.

8. The charging circuit as claimed in claim 7, wherein the comparison unit comprises:
   a first comparator comparing the reference voltage with the first predetermined value; and
   a second comparator comparing the reference voltage with the second predetermined value.

9. The charging circuit as claimed in claim 8, wherein the comparison unit further comprises:
   a D-type flip-flop comprising an input terminal coupled to the output terminal of the first comparator, a clock terminal coupled to the output terminal of the second comparator, and an output terminal; and
   a logic unit comprising a first input terminal coupled to the output terminal of the D-type flip-flop, a second input terminal coupled to the output terminal of the first comparator, and an output terminal outputting the control signal.

10. The charging circuit as claimed in claim 9, further comprising a voltage divider providing the first predetermined value.

11. The charging circuit as claimed in claim 10, wherein the first voltage is the second predetermined value.

12. An integrated circuit driving a load, comprising:
   a reference capacitor storing a reference voltage;
   an amplifier driving the load according to a voice signal and the reference voltage;
   a power supply providing one of a first voltage and a second voltage to the reference capacitor according to a control signal, wherein the reference voltage is generated by the reference capacitor according to the first voltage and the second voltage; and
   a comparison unit deactivating the control signal and providing the first voltage to the reference capacitor when the reference voltage is less than a first predetermined value and activating the control signal and providing the second voltage to the reference capacitor when the reference voltage is less than a second predetermined value and exceeds or equals the first predetermined value.

13. The integrated circuit as claimed in claim 12, wherein the control signal is deactivated by the comparison unit when the reference voltage exceeds or equals the second predetermined value.

14. The integrated circuit as claimed in claim 12, wherein the power supply comprises:
   a first charging module providing the first voltage; and
   a second charging module providing the second voltage.

15. The integrated circuit as claimed in claim 14, wherein the first charging module is a voltage divider or a constant current source and wherein the second charging module is a voltage divider or a constant current source.

16. The integrated circuit as claimed in claim 14, wherein the power supply further comprises a selection module coupled to the first charging module, the second charging module and the reference capacitor for providing the first voltage to the reference capacitor when the control signal is deactivated and providing the second voltage to the reference capacitor when the control signal is activated.

17. The integrated circuit as claimed in claim 16, wherein the selection module comprises:
   a first switch unit coupled between the first charging module and the reference capacitor, wherein the first switch unit is turned on when the control signal is deactivated and the first switch unit is turned off when the control signal is activated; and
   a second switch unit coupled between the second charging module and the reference capacitor, wherein the second switch unit is turned off when the control signal is deactivated and the second switch unit is turned on when the control signal is activated.

18. The integrated circuit as claimed in claim 17, wherein the second switch unit comprises:
   a PMOS transistor comprising a gate, a source coupled to the second charging module, and a drain coupled to the reference capacitor; and
   an inverter comprising an input terminal receiving the control signal and an output terminal coupled to the gate.

19. The integrated circuit as claimed in claim 18, wherein the comparison unit comprises:
   a first comparator comparing the reference voltage with the first predetermined value; and
   a second comparator comparing the reference voltage with the second predetermined value.

20. The integrated circuit as claimed in claim 19, wherein the comparison unit further comprises:
   a D-type flip-flop comprising an input terminal coupled to the output terminal of the first comparator, a clock terminal coupled to the output terminal of the second comparator, and an output terminal; and
   a logic unit comprising a first input terminal coupled to the output terminal of the D-type flip-flop, a second input terminal coupled to the output terminal of the first comparator, and an output terminal outputting the control signal.

21. The integrated circuit as claimed in claim 20, further comprising a voltage divider providing the first predetermined value.

22. The integrated circuit as claimed in claim 21, wherein the first voltage is the second predetermined value.

23. A control method for a bridge tied load (BTL) comprising an amplifier and a load driven by the amplifier according to a voice signal and a reference voltage stored in a reference capacitor, comprising:
  providing a first voltage to the reference capacitor;
  determining whether the reference voltage exceeds a first value;
  providing the first voltage to the reference capacitor when the reference voltage is less than the first predetermined value;
  providing a second voltage to the reference capacitor when the reference voltage exceeds the first predetermined value;
  determining whether the reference voltage exceeds a second value; and
  providing the second voltage to the reference capacitor when the reference voltage is less than the second predetermined value.

24. The control method as claimed in claim 23, wherein the first voltage is provided to the reference capacitor when the reference voltage exceeds or equals the second predetermined value.

25. The charging circuit as claimed in claim 1, wherein the comparison unit provides the first voltage to the reference capacitor when the reference voltage exceeds the second predetermined value.

26. The integrated circuit as claimed in claim 12, wherein the comparison unit provides the first voltage to the reference capacitor when the reference voltage exceeds the second predetermined value.

* * * * *